(12) United States Patent
Noelscher et al.

(10) Patent No.: US 7,535,044 B2
(45) Date of Patent: May 19, 2009

(54) SEMICONDUCTOR DEVICE, METHOD FOR MANUFACTURING A SEMICONDUCTOR DEVICE AND MASK FOR MANUFACTURING A SEMICONDUCTOR DEVICE

(75) Inventors: Christoph Noelscher, Nuremberg (DE); Dietmar Temmler, Dresden (DE)

(73) Assignee: Qimonda AG, Munich (DE)

( * ) Notice: Subject to any disclaimer, the term of this patent is extended or adjusted under 35 U.S.C. 154(b) by 162 days.

(21) Appl. No.: 11/700,547

(22) Filed: Jan. 31, 2007

(65) Prior Publication Data

US 2008/0179705 A1 Jul. 31, 2008

(51) Int. Cl.
*H01L 27/108* (2006.01)
(52) U.S. Cl. .................... 257/296; 257/773
(58) Field of Classification Search ............. 257/296, 257/773, 775, 900
See application file for complete search history.

(56) References Cited

U.S. PATENT DOCUMENTS

| 6,905,899 B2 | 6/2005 | Yang |
| 2006/0024621 A1 | 2/2006 | Nölscher et al. |
| 2006/0046160 A1 | 3/2006 | Wallace et al. |
| 2006/0074187 A1 | 4/2006 | Stark et al. |
| 2006/0218520 A1 | 9/2006 | Pierrat et al. |
| 2008/0179705 A1* | 7/2008 | Noelscher et al. ........... 257/506 |

FOREIGN PATENT DOCUMENTS

| DE | 42 35 702 A1 | 4/1994 |
| DE | 42 36 609 A1 | 5/1994 |
| DE | 101 15 290 B4 | 6/2005 |
| DE | 10 2004 034 572 A1 | 2/2006 |
| DE | 103 01 475 B4 | 10/2007 |
| WO | WO 02/12959 A1 | 2/2002 |

OTHER PUBLICATIONS

Noelscher, C., et al., "Double patterning down to k1=0.15 with bilayer resist," SPIE Advanced Conferences+Courses, Conference 6924, Session 6, Feb. 27, 2008, 12 pages.
Noelscher, C., et al., "Double line shrink lithography at $k_1$=0.16," Microelectronic Engineering 83, 2006, pp. 703-733, Feb. 2006.

* cited by examiner

*Primary Examiner*—Mark Prenty
(74) *Attorney, Agent, or Firm*—Slater & Matsil, L.L.P.

(57) ABSTRACT

A semiconductor device with a substrate includes a structure. The structure has a first part and a second part. At least one section of the edge of the first part of the structure is at an essential constant distance measured parallel to the substrate to a first section of an edge of a second structure. At least one section of the edge of the second part of the structure is lined with an edge of a second section of the same second section. The first section of the edge of the second structure and a second section of the edge of the second structure merge at least at one point, whereby the angle between the tangents of the edges of the first and second section of the second structure is less than 90°. The structure and the second structure are distanced by a spacer structure.

23 Claims, 7 Drawing Sheets

SEMICONDUCTOR DEVICE, METHOD FOR MANUFACTURING A SEMICONDUCTOR DEVICE AND MASK FOR MANUFACTURING A SEMICONDUCTOR DEVICE

TECHNICAL FIELD

This invention relates generally to a semiconductor device, a method for manufacturing a semiconductor device and a mask for manufacturing a semiconductor device.

BACKGROUND

In the semiconductor industry, such as the memory chip industry, there is a constant drive to manufacture smaller structures to gain a higher integration on the memory chips.

One approach to achieve this is the use of shorter wavelengths (e.g., EUV lithography) to produce smaller structures. Another approach tries to reduce the structure size by immersion lithography by interposing a liquid medium between the optics and a surface of a substrate, such as a silicon wafer, replacing the usual air gap. This liquid has a refractive index greater than one. The wavelength in the liquid is reduced by a factor equal to the refractive index.

All this requires considerable development costs. Therefore, an incentive exists to produce structures and lithography methods which allow the usage of current technology while reducing the size of the manufactured structures.

To use the potential of the existing illumination sources (e.g., lithography with wavelengths of 193 nm or 248 nm), the manufacturing of fine sublithographic structures, especially fine regular line structures, using spacer techniques, has been described, e.g., in the DE 42 35 702 A1 and DE 42 36 609 A1. In DE 42 36 609 A1 a line-by-spacer method is described to produce sublithographic spacers. In US20060024621A1 and DE102004034572A1 a line-by-spacer-fill and a line-by-liner-fill method are described. Line shrink methods are described in the article in Microelectronic Engineering 83, pages 730 to 733. Embodiments of the current invention provide a structure which can be manufactured using the existing lithography tools.

SUMMARY OF THE INVENTION

Embodiments of the invention are concerned with a semiconductor device on a substrate comprising a structure. The structure has a first part and a second part whereby at least one section of the edge of the first part of the structure is at an essentially constant distance measured parallel to the substrate to a first section of an edge of a second structure. At least one section of the edge of the second part of the structure is lined with an edge of a second section of the same second section. The first section of the edge of the second structure and a second section of the edge of the second structure merge at least at one point, whereby the angle between the tangents of the edges of the first and second section of the second structure is less than 90°. The structure and the second structure are distanced by a spacer structure.

Furthermore, the embodiments of the invention are concerned with a method for manufacturing a semiconductor device with a structure with a first part and a second part. At least one vertical side of the first part is lined with a first section of a spacer structure and lining at least one vertical side of the second part with a second section of a spacer structure. The first section of the spacer structure and the second section of the spacer structure merging at least at one point, whereby the angle between tangents of the first and second section of the spacer structure is less than 90°. The space between the first and second sections of the spacer structure is filled with a second structure, especially a fill structure.

BRIEF DESCRIPTION OF THE DRAWINGS

Objects and advantages of embodiments of the invention become apparent upon reading of the detailed description of embodiments of the invention, and the appended claims provided below, and upon reference to the drawings.

DETAILED DESCRIPTION OF ILLUSTRATIVE EMBODIMENTS

Figure 1:
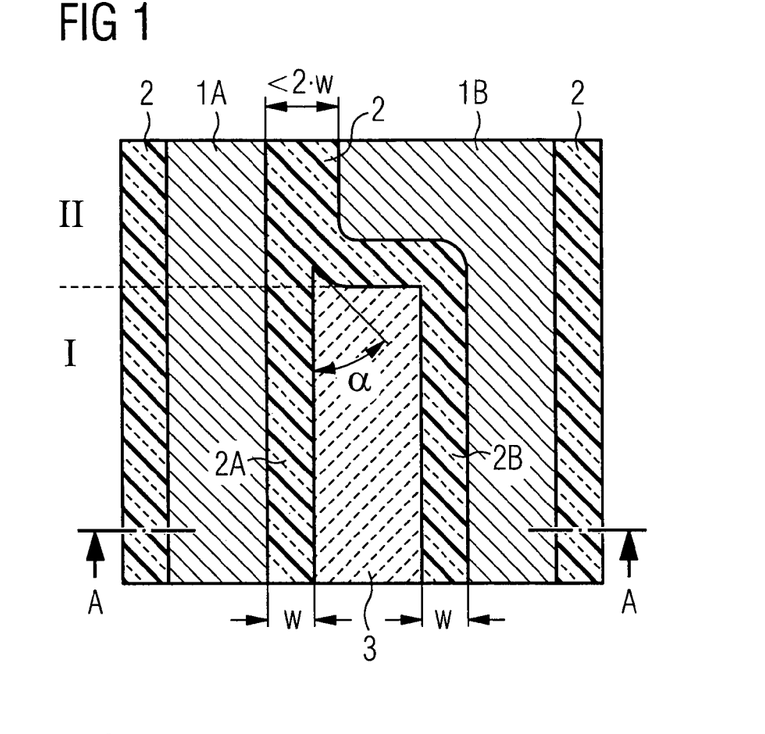
FIG. 1 shows schematically a top view of a part of a semiconductor device being a first embodiment.

In FIG. 1 a structure 1A and 1B with a first part 1A and a second part 1B is shown. Such a structure 1A and 1B is, e.g., part of a line in a DRAM-chip like a line in a gate level or in a metal level. The structure 1 is fabricated in one step only by lithography on a silicon substrate. This has the advantage that a very dense pattern as well as relaxed patterns can be fabricated by a single lithographic patterning and later integration steps.

Other preferable applications of the structure in a semiconductor device are Flash-memory chips, NROM- and NAND memory chips, optoelectronic devices and microprocessors. Another preferred application is a fanout structure in a memory chip.

A typical material for the structure 1A and 1B is, e.g., a-Silicon.

Other material might be resist, Si oxide, SiON, Tungsten, Al or other metallic compounds.

The parts 1A and 1B of the structure are separated by a spacer structure 2 (liner structures) which in FIG. 1 are spacer linings made from $Si_3N_4$. The purpose of the spacer structure 2 is the providing of a space for a second structure, here fill structure 3, as will be described later on. In the following examples the second structure 3 is generally a fill structure. The person skilled in the art will recognize that other second structures 3 fall within the scope of embodiments of the present invention.

The spacer structure 2 is, in the present embodiment, a sublithographic structure which is manufactured with one of the above mentioned spacer technologies. The spacer technologies allow the manufacturing of structures, smaller than the resolution of the employed lithography equipment.

The characteristic distance between two fill structures can be larger than the limiting resolution of the lithography equipment.

The distance between two edges of the structure 1 is smaller than twice the spacer thickness minus a safety margin. This distance describes the effect of a "strangulation" or "constriction" of the fill structure 3 by the spacer structures. The process works in a way that even in the worst case of the process variation (i.e., the widest gap and smallest spacer widths) the strangulation will be effective.

Spacer thickness variations and variations of the first CD after etch are typically 2-10% each.

The spacer structure 2 comprises preferably a dielectric material. The dielectric material comprises preferably at least one of the groups of a sublithographic structure, a sublithographic line-spacer element, a sublithographic silicon oxide $SiO_2$ structure, a sublithographic $SiO_xN_y$ structure, a sublithographic $Si_3N_4$ structure, a sublithographic $SiN_x$ structure and an airfilled space.

Figure 2A:
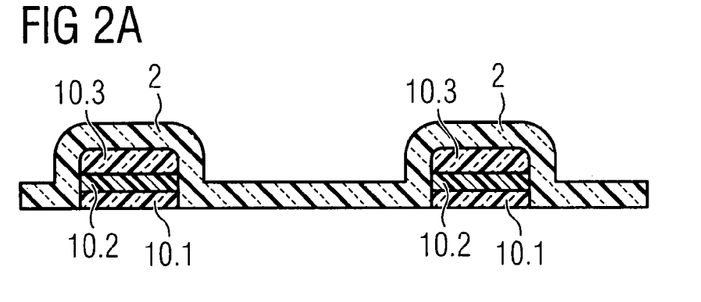
FIG. 2A shows schematically a cross section of a semiconductor device after the first processing step.
Figure 2B:
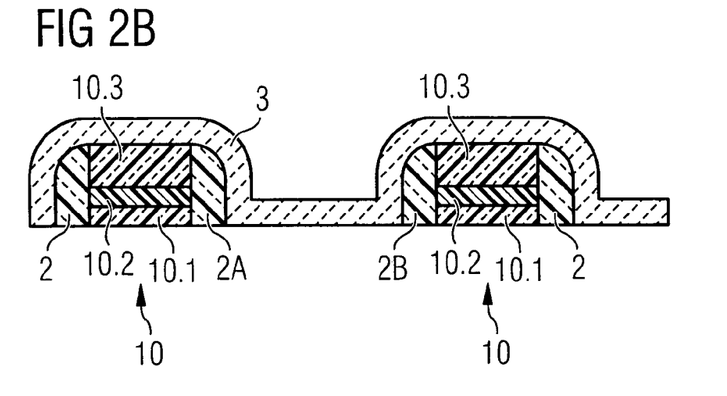
FIG. 2B shows schematically a cross section of a semiconductor device after the second processing step.

It is noted that, e.g., in FIG. 1 the spacer structure 2 is filled with a solid material, i.e., $Si_3N_4$, since FIG. 1 shows the structure to be manufactured after a certain process step (see FIG. 2B). As will be described in connection with the manufacturing method, the spacer structure 2 can also be an airfilled gap or a void filling the space formerly occupied by the solid material.

The spacer structure 2 has the same width W measured rectangularly from the structure 1A and 1B, since the spacer is manufactured by a single deposition of the solid material.

Therefore, one section of the edge of the first part 1A of the structure is at an essentially constant distance measured parallel to the silicon substrate (parallel to the paper plane in FIG. 1) to a first section of an edge of a second structure, i.e., the fill structure 3 in FIG. 1. The constant distance is filled with a spacer structure 2A. The measured distance is essentially constant depending on process variations.

Edge in this context means the boundary line of the respective structure.

Furthermore, at least one section of the edge of the second part 1B of the structure is lined with an edge of a second section 2B of the same second section.

The spacer structure 2 comprises two sections 2A and 2B which line on one side the edges of the structure 1A and 1B, on the other side they line the fill structure 3.

The fill structure 3 in this embodiment is the second structure 3 mentioned above. The second structure 3 can be a pattern in a layout or a printed wafer. The second structure 3 can also be a temporary structure in a hardmask which is subsequently transferred into a layer below. The fill structures 3 (or second structures in general) 3 are part of the electrical circuit which is manufactured either directly or indirectly after a transfer of the structure.

Apart from a process bias the fill structures 3 result from the common layout of the first structure and the fill structure. The fill pattern 3 can be, e.g., a wiring in a connection layer, a wiring and gate in a GC layer or an insulation in an active area layer. Further examples for the use of fill structures 3 and structures are described in connection with FIG. 5. The fill structures or fill patterns in the device may be generated either directly or by a state of the art pattern transfer technology from hard mask structures at the wafers.

The first section (i.e., the inner edge of the spacer structure 2A) of the edge of the second structure and a second section (i.e., the inner edge of the spacer structure 2B) of the edge of the second structure merge at least at one point, whereby the angle α between the tangents of the edges of the first and second section of the second structure is less than 90°.

In FIG. 1 the merging of the edges of the fill structure 3 shows an angle of less than 90°. The reason is that such angles are characteristic for the spacer and the fill method that have been applied in the course of manufacturing.

In a manufactured memory chip the merging is displaced from the intersection point by a rounding due to processing by typically less than the spacer width, especially less than half of the spacer width, but sometimes even larger.

Structures 1 and fill structures 3, as depicted in FIG. 1, are used to manufacture conducting and non-conducting lines very close to each other so that both of them are only separated by the spacer structures 2.

In the embodiment according to FIG. 1 the spacer structure 2, 2A and 2B are asymmetric relative to the fill structure 3. The constriction of the fill structure 3 is more effected from one side than from the other.

Figure 1A:
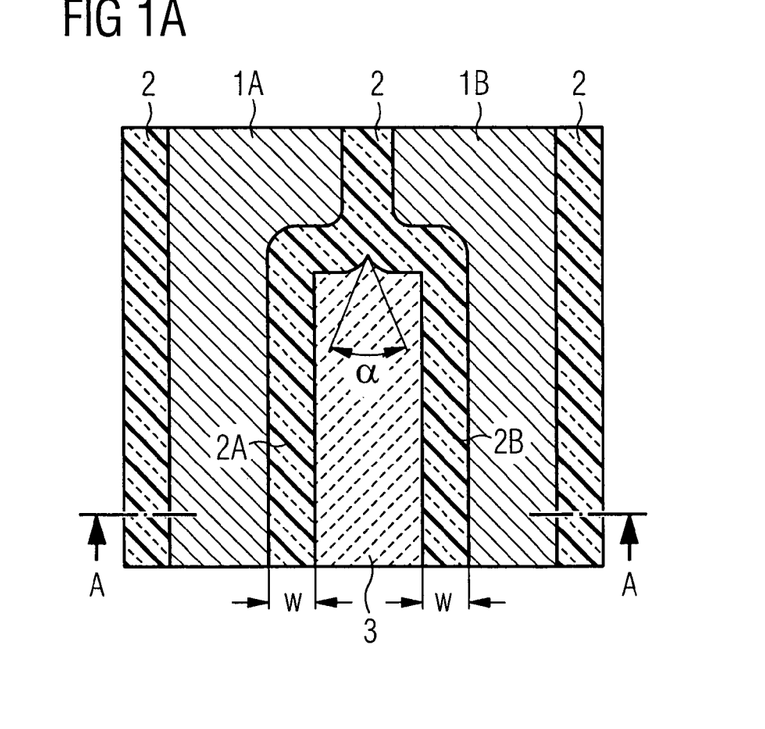
FIG. 1A shows a variant of the embodiment according to FIG. 1.

The embodiment shown in FIG. 1A is generally the same as described in connection to FIG. 1 so that reference is made to the relevant description. The difference to the embodiment in FIG. 1 is that in the embodiment according to FIG. 1A the spacer 2, 2A and 2B are symmetric to the fill structure. The first and second sections merge at one point and the angle between the tangents of the edges of the first and second section of the second structure is less than 90°.

Another feature of the embodiment of the invention is, that the width W of the spacer structures 2A and 2B is constant due to the line-by spacer method (see FIG. 2 and reference cited above). The constriction of the fill structure 3 results in a portion of the spacer structure 2 which has a width smaller than 2*W.

In FIG. 1 a first portion A and a second portion B are depicted, referring to portions of the spacer structure having different widths.

Therefore the embodiments of the invention also refer to a semiconductor device comprising, a layer with a line-by-spacer structure 2, 2A and 2B arrangement in at least a portion of the semiconductor device, the structure arrangement having a set of primary structures 1A and 1B and a set of secondary structures 3 (e.g., a fill structure), the secondary structures 3 being distanced from the adjacent primary structures by a constant width W. The embodiments of the invention further comprises, a first primary structure 1A and a second primary structure 1B with a secondary structure 3 laterally arranged between them in a first portion I of the semiconductor device, the secondary structure 1B being terminated at the boundary to a second portion II of the semiconductor device. The distance between the first primary structure 1B and second primary structure 1B is greater than 2*W in the first portion I, and smaller than 2*W in the second portion II of the semiconductor device.

The constriction in this embodiment of the invention results in the narrowing of the spacer structure in the second portion II.

A person skilled in the art will recognize that all advantageous embodiments described in connection with other embodiments of the invention will be applicable to this embodiment as well. Further below a particular adaptation will be described in connection with FIG. 3D.

Before going into further details, manufacturing steps for the spacer structure are described.

In FIG. 2A to 2D manufacturing steps are described in cross sections along line A-A in FIG. 1.

The starting points in FIG. 2A are two structures 10, comprising three layers 10.1, 10.2 and 10.3. In the finished product, those structures will be conducting lines in a DRAM-chip.

The lower level of the structures 10 is an a-Silicon layer 10.1. Above this a hard layer 10.2, comprising $SiO_xN_y$ is positioned. This hard layer is used as a stop layer in a CMP processing step. In other embodiments the hard stop comprises a silicon oxide, especially at least one of the groups of $SiO_x$, $Si_3N_4$ and $SiO_2$.

Above the hard layer 10.2, another a-Silicon layer 10.3 is positioned. This other a-Silicon layer 10.3 is softer than the hard layer 10.2.

The two structures 10 are covered with a spacer layer 2 which is made of $Si_3N_4$ in this example. The spacer 2 lines the vertical sides of the structures 10. This manufacturing step is principally known from spacer technologies mentioned above.

After removing the horizontal portions of the spacer layer 2 (sometimes called "liner") a fill structure 3 is deposited on the structures 10 and in the area between the structures 10. This is a self-aligning process for the fill structure 3. The situation after this process steps is shown in FIG. 2B.

Figure 2C:
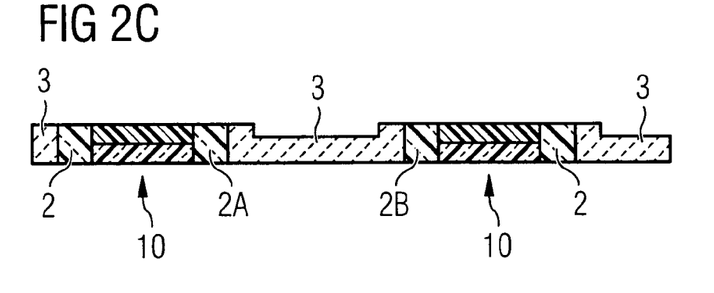
FIG. 2C shows schematically a cross section of a semiconductor device after the third processing step.

The next process step is a CMP process step, polishing the fill structure 3 and the top parts of the spacer structure 2 and the structures 10. The CMP step stops at the hard layer 10.2. The top view of the structure depicted in FIG. 2C is the one of the structure shown in FIG. 1, i.e., the spacer structure 2 is present as a solid material. The two sections 2A and 2B of the spacer section are lining the vertical sides of the structures 10 facing the fill structure 3.

Figure 2D:
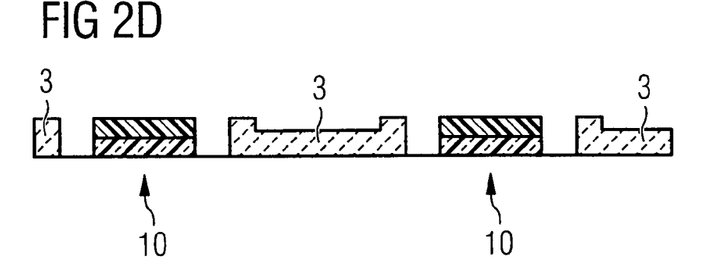
FIG. 2D shows schematically a cross section of a semiconductor device after the fourth processing step.

After etching the spacer structure 2, the spacer structure 2 is formed by an airfilled gap or void, as shown in FIG. 2D.

The completed structures 10, as shown in FIG. 2D, can be manufactured with only one exposure and only one mask.

Analogous to FIG. 1, in FIG. 3A to 3D different structures 1, spacer structures 2 and fill structures 3 are shown.

Figure 3A:
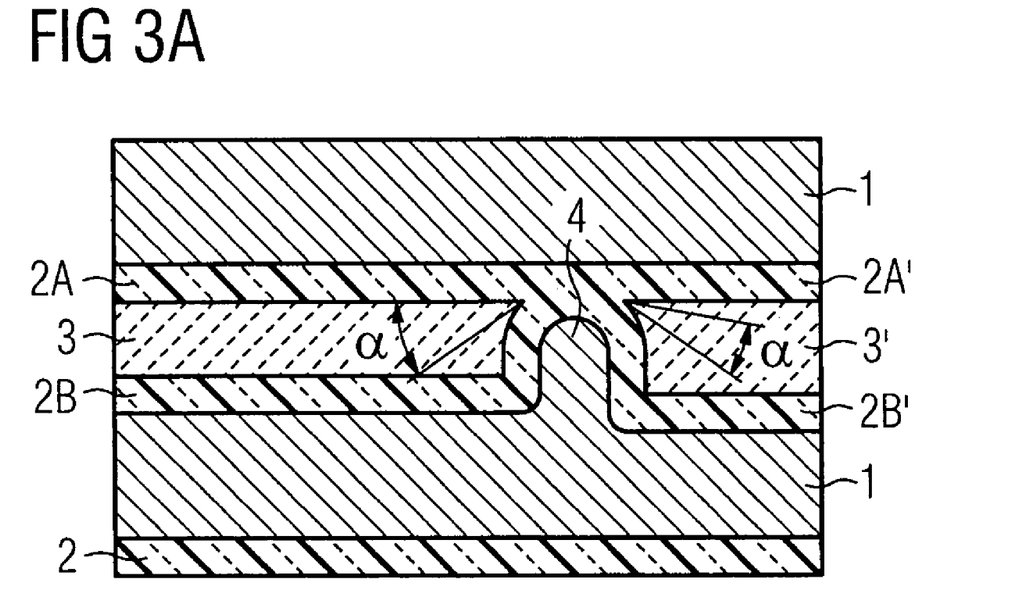
FIG. 3A shows schematically a top view of a part of a semiconductor device being a second embodiment.

In FIG. 3A the fill structure 3 is split into two parts 3 and 3' by an auxiliary structure 4. The auxiliary structure 4 being in this embodiment a part of structure 1 protruding into the fill structure 3. The spacer structure 3 blocks the passage between the two areas by merging the two sections 2A and 2B and the two sections 2A' and 2B' respectively. The remaining area between the space structures 2 is then filled with the fill structure 3 and 3'. As shown in connection with FIG. 2A to 2D the fill structures 3 and 3' are deposited in a self aligned way to structures 1.

In effect the auxiliary structure 4 constricts the fill structure 3. As in the embodiment shown in FIG. 1, angles α of the tangents of the edges of the fill structure 3 at the merging point of the spacer structures 2 are both smaller than 90°. In case of strong rounding of corners in following processes the minimum angle of the tangents might become greater than 90°, while the separation of 3 and 3' is maintained.

In a normal single exposure design the separating pattern extension does not exist. Therefore this feature provides another characteristic of an embodiment of the invention, besides the angle being less than 90° characteristic, even in case of angles greater than 90° due to subsequent processing.

The constriction of the fill structure 3 can be obtained in a different way by using two auxiliary structures 4A and 4B. In the embodiment shown in FIG. 3B, two auxiliary structures 4A and 4B extend from the structure 1. These auxiliary structures 4A and 4B protrude into a fill structure 3 which is somewhat wider than in the embodiment shown in FIG. 3A. Since both auxiliary structures 4A and 4B with the respective spacer lining 2A, 2A', 2B and 2B' are positioned in a staggered way, each of the auxiliary structures 4A and 4B constricts somewhat more than a half of the fill structure.

Figure 3B:
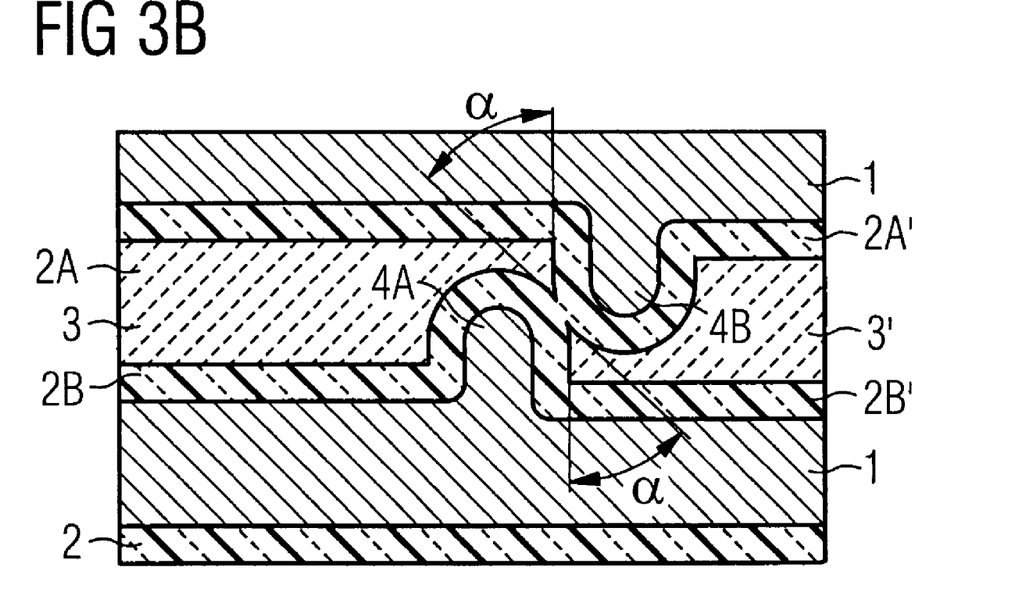
FIG. 3B shows schematically a top view of a part of a semiconductor device being a third embodiment.
Figure 3C:
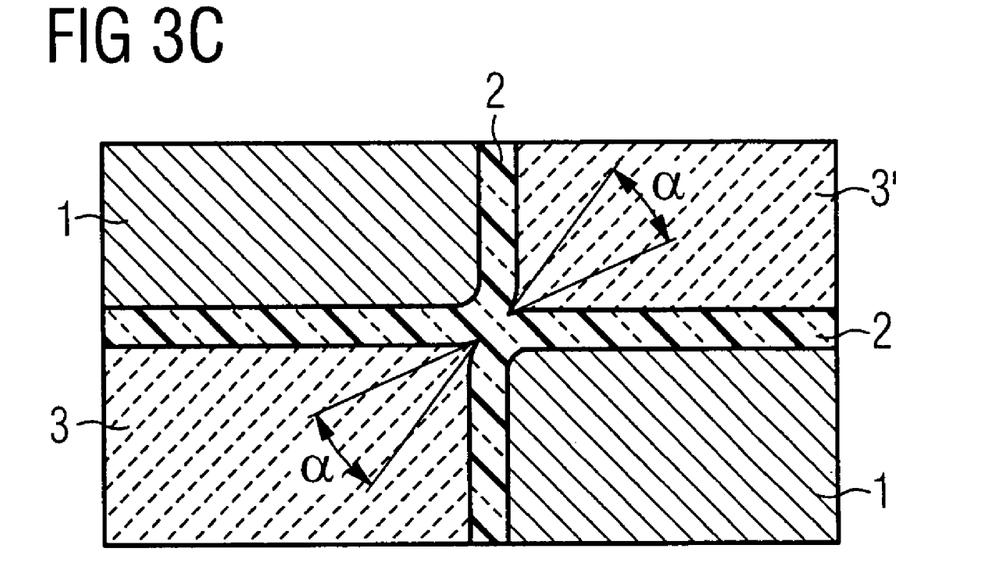
FIG. 3C shows schematically a top view of a part of a semiconductor device being a fourth embodiment.

In FIG. 3C a different embodiment is shown. As in FIGS. 3A and 3B the fill structure 3 is separated into two parts 3 and 3' using a spacer structure 2 which has been deposited as lining to the structure 1. At the merging of the spacer structures 2, the angles of the tangents at the edges of the fill structure 2 are less then 90°.

Figure 3D:
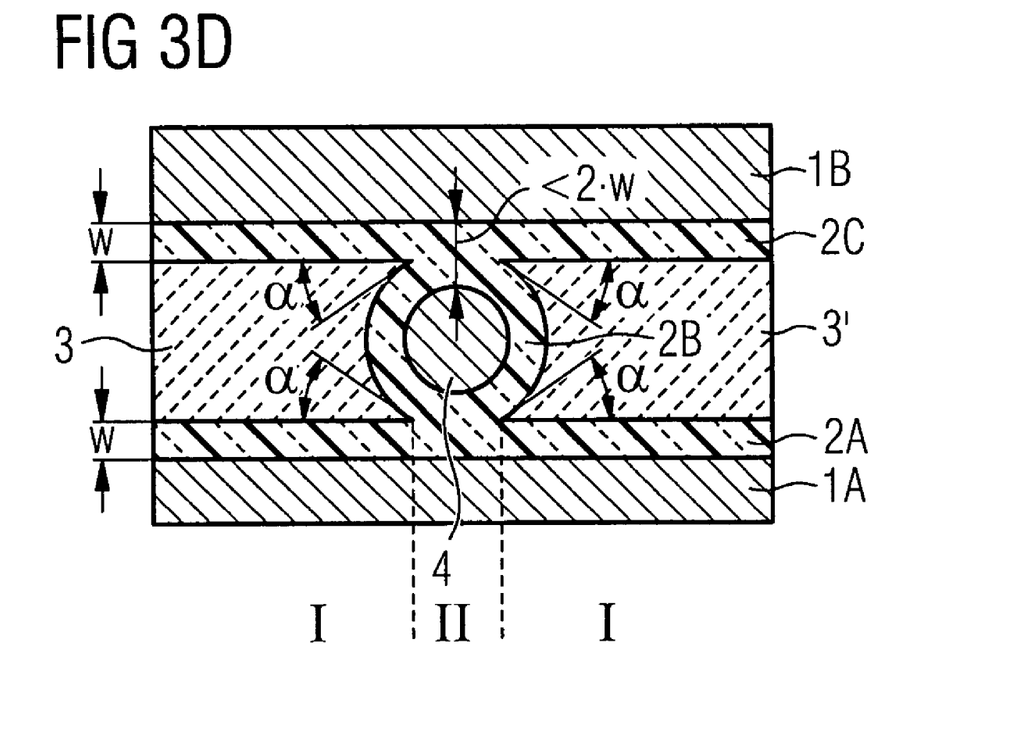
FIG. 3D shows schematically a top view of a part of a semiconductor device being a fifth embodiment.

In FIG. 3D another embodiment is shown. Here the structure 1 comprises two lines which are lined with a spacer structure 2A, 2C. In addition an auxiliary structure 4 is positioned between the structures 1. The spacer structure 2B is completely encircling the auxiliary structure 4. As the auxiliary structure 4 shown in FIGS. 3A and 3B, this separates the fill structure 3 into two parts 3 and 3'.

The spacer structure 2, having three sections 2A, 2B and 2C has two merging points, with four angles α smaller than 90°.

The auxiliary structure 4 in this embodiment can be a dummy structure.

In connection with FIG. 1 an embodiment of the invention was described using the widths W of the spacer structure. Embodiments like the one in FIG. 3D are concerned with semiconductor devices comprising, a layer with a line-by-spacer structure arrangement in at least a portion of the semiconductor device, the structure arrangement having a set of primary structures 1A, 1B and 4 and a set of secondary structures 3 and 3' (e.g., fill structures), the secondary structures 3 and 3' being laterally distanced from the adjacent primary structures 1A and 1B by a width W. The semiconductor device further comprises a terminating primary structure (e.g. an auxiliary structure) 4, a first primary structure 1A and a second primary structure 1B with a secondary structure 3 and 3' laterally arranged between them in a first portion I of the semiconductor device, the secondary structure 3 and 3' being terminated at the boundary to a second portion II of the semiconductor device. The lateral distance between the first and second primary structure is greater than 2*W in the first portion I, and the terminating structure 4 is located at the boundary between first portion I and second portion II and laterally between the first primary structure 1A and second primary structure 1B. The minimum distance between the terminating structure 4 and both of the first and second primary structures 1A and 1B being smaller than 2*W.

As can be seen from FIG. 3A to 3D the angle between the tangents can be less then 90°, especially less than 60°, especially less than 45°, especially less than 30°.

In FIG. 4A to 4D parts of the mask embodiments are shown, which are used to manufacture the structures shown in FIG. 3A to 3D. It should be noted that the masks can be a transmission mask or a reflective mask, depending on the wavelength used in the lithography.

Figure 4A:
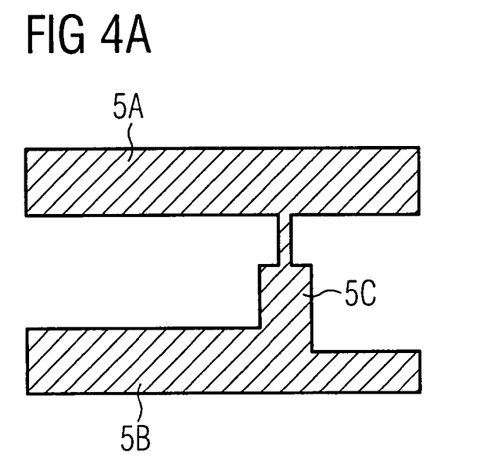
FIG. 4A shows schematically a mask structure for manufacturing the embodiment depicted in FIG. 3A.

In FIG. 4A the upper part 5A and lower part 5B are dark sections on a lithographic mask, resulting in the structures 1 in FIG. 3A by use of a positive tone resist. The auxiliary structure 4 in FIG. 3A is formed by a linear element 5C having a part with a broad width and a part with a thin width, the part with the broad width producing the auxiliary structure 4.

Figure 4B:
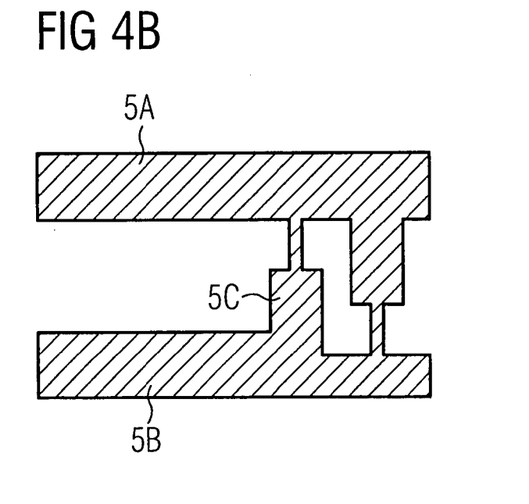
FIG. 4B shows schematically a mask structure for manufacturing the third embodiment depicted in FIG. 3B.

In FIG. 4B the mask is modified to produce the two staggered auxiliary structures 4A, 4B as shown in FIG. 3B.

Figure 4C:
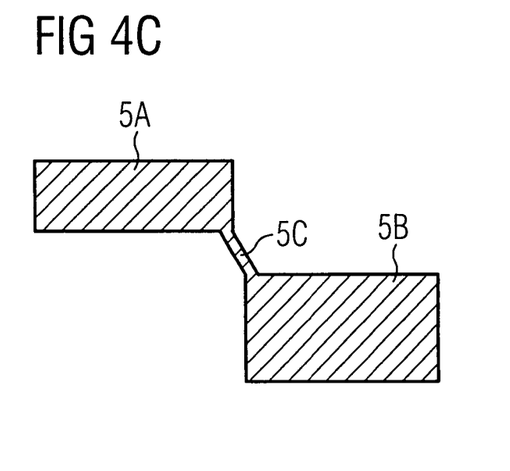
FIG. 4C shows schematically a mask structure for manufacturing the fourth embodiment depicted in FIG. 3C.

In FIG. 4C the mask portion for manufacturing the embodiment shown in FIG. 3C is depicted. Here, the dark parts 5A and 5B are connected with a small linear part 5C, forming an auxiliary structure connecting the parts 5A and 5B.

Figure 4D:
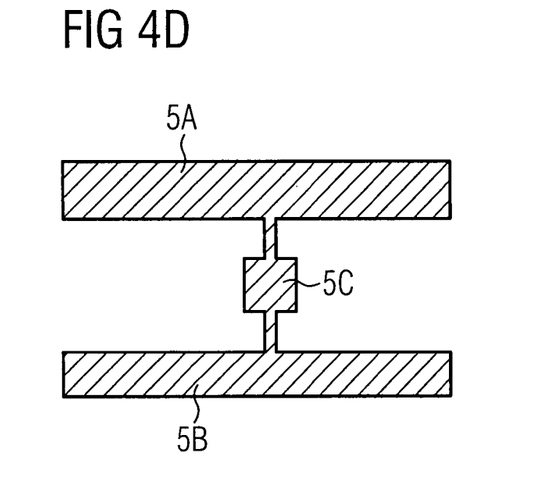
FIG. 4D shows schematically a mask structure for manufacturing the embodiment depicted in FIG. 3D.

In FIG. 4D a mask portion for manufacturing the embodiment shown in FIG. 4C is depicted. The dark parts 5A and 5B result in the structures 1 in FIG. 3D. The auxiliary structure 4 is produced by the widened part in the linear structure 5C.

Figure 5:
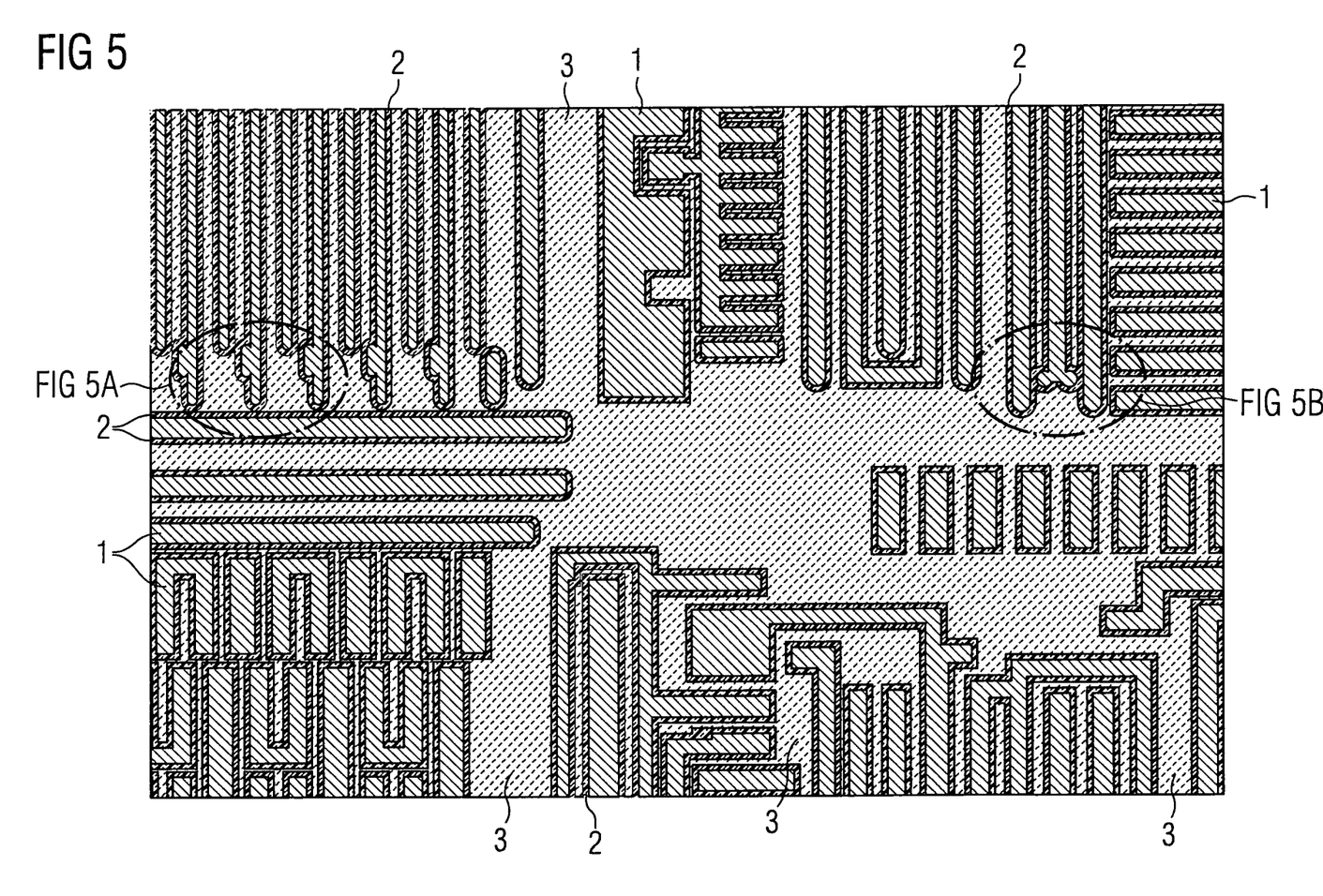
FIG. 5 shows a part of a layout with two areas in which embodiments of the invention are used.

In FIG. 5 an overview of a section of a layout is shown. Here the structure 1 is part of a GC layer. Two different embodiments of the invention are shown here in two different areas.

Figure 5A:
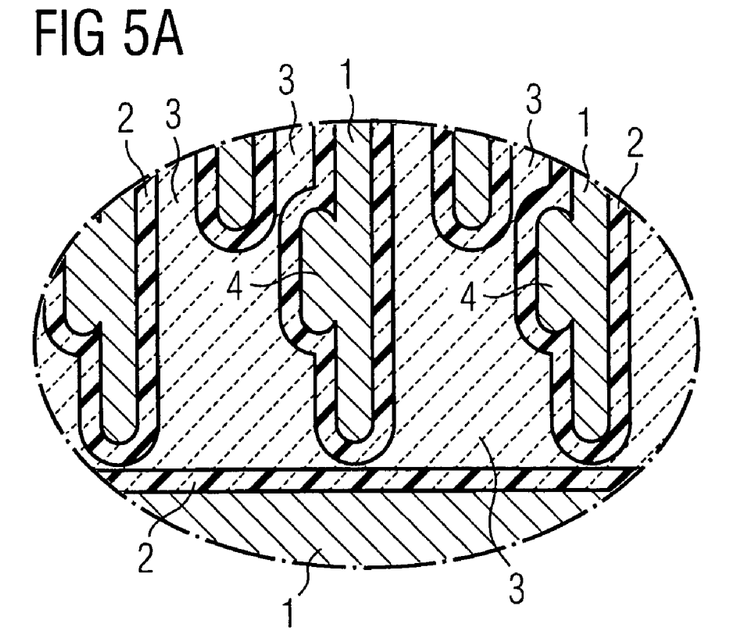
FIG. 5A shows a first enlargement of a section of FIG. 5.

In FIG. 5A a plurality of structures 1 has auxiliary structures 4 protruding to the left, constricting the fill structure 3. The result is that the auxiliary structures 4 widen the structure 1 asymmetrically at the end so that the structure 1 has a landing pad area. Alternatively a symmetric widening can be used.

The fill structure 3 on the other hand has a relatively wide area as well which also can be used a landing pad. The landing pads of the structures 1 and 3 is separated by spacers 2. Especially if a sublithographic spacer technique is used, a very dense landing pad pattern can be manufactured.

Figure 5B:
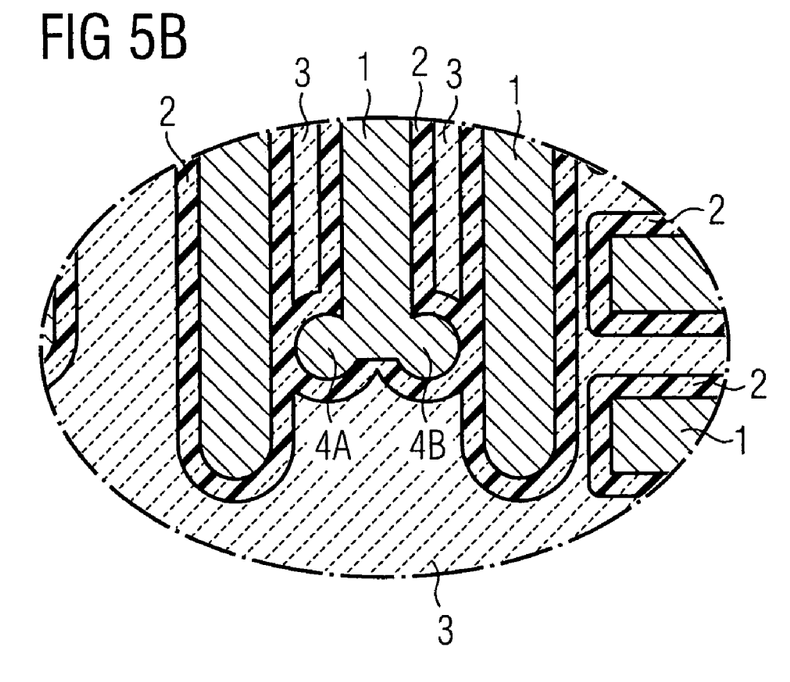
FIG. 5B shows a second enlargement of a section of FIG. 5.

In FIG. 5B a further embodiment of the invention is depicted. Here one part of the structure 1 has two symmetrically positioned auxiliary structure 4A and 4B constricting the surrounding fill structure 3.

What is claimed is:

1. A semiconductor device with a substrate, the semiconductor device comprising a structure having a first part and a second part, wherein:
   at least one section of an edge of the first part of the structure is at an essentially constant distance measured parallel to the substrate to a first section of an edge of a second structure;
   at least one section of the edge of the second part of the structure is lined with an edge of a second section of the same second section;
   the first section of the edge of the second structure and a second section of the edge of the second structure merge at least at one point, whereby the angle between the tangents of the edges of the first and second section of the second structure is less than 90°; and
   the structure and the second structure are distanced by a spacer structure.

2. The semiconductor device according to claim 1, wherein the second structure is a fill structure.

3. The semiconductor device according to claim 1, wherein the edge of the first section of the second structure and the edge of the second section of the second structure merge closely to the intersection point of the tangents.

4. The semiconductor device according to claim 3, wherein the merging is displaced from the intersection point by a rounding due to processing by less than the spacer width.

5. The semiconductor device according to claim 1, wherein two parts of the second structure are separated by at least one auxiliary structure, so that the edges of the parts of the second section merge at least in two points, whereby the angle between the tangents of the edges are less than 90°.

6. The semiconductor device according to claim 5, wherein the second section of the second structure encloses the auxiliary structure.

7. The semiconductor device according to claim 5, wherein the auxiliary structure comprises a dummy structure.

8. The semiconductor device according to claim 1, wherein the angle between the tangents is less than 60°.

9. The semiconductor device according to claim 1, wherein the second structure comprises a rounded section at the intersection point of the tangents.

10. The semiconductor device according to claim 1, wherein the second structure is constricted by at least one of a group of a spacer structure and an auxiliary structure.

11. The semiconductor device according to claim 1, wherein the second structure is constricted by at least one spacer structure that is part of an auxiliary structure.

12. The semiconductor device according to claim 1, wherein the spacer comprises a sublithographic structure.

13. The semiconductor device according to claim 1, wherein the spacer structure comprises a dielectric material.

14. The semiconductor device according to claim 13, wherein the dielectric material comprises at least one structure selected from the group consisting of a sublithographic structure, a sublithographic line-spacer element, a sublithographic silicon oxide structure, a sublithographic $SiO_xN_y$ structure, a sublithographic $Si_3N_4$ structure, a sublithographic $SiN_x$ structure and an airfilled space.

15. The semiconductor device according to claim 1, wherein the second structure comprises silicon.

16. The semiconductor device according to claim 1, wherein the semiconductor device comprises a device selected from the group consisting of a memory chip, a DRAM-memory chip, an NROM-memory chip and a microprocessor.

17. The semiconductor device according to claim 1, wherein the structure comprises part of a fanout structure in a memory chip.

18. The semiconductor device according to claim 1, wherein the structure comprises a stop layer for a chemical mechanical polish (CMP) process.

19. The semiconductor device according to claim 18, wherein the stop layer comprises a layer selected from a group consisting of silicon oxide, silicon nitride, silicon oxynitride and combinations thereof.

20. The semiconductor device according to claim 18, further comprising a softer layer positioned above the stop layer.

21. The semiconductor device according to claim 1, wherein the substrate comprises a silicon wafer.

22. A semiconductor device comprising:
   a layer with a line-by-spacer structure arrangement in at least a portion of the semiconductor device, the structure arrangement having a set of primary structures and a set of secondary structures, the secondary structures being distanced from the adjacent primary structures by a constant width W; and
   a first and a second primary structure with a secondary structure laterally arranged between them in a first portion of the semiconductor device, the secondary structure being terminated at the boundary to a second portion of the semiconductor device;
   wherein the distance between the first and second primary structure is greater than 2*W in the first portion, and smaller than 2*W in the second portion of the semiconductor device.

23. A semiconductor device comprising:
   a layer with a line-by-spacer structure arrangement in at least a portion of the semiconductor device, the structure arrangement having a set of primary structures and a set of secondary structures, each secondary structure being distanced from an adjacent primary structure by a width W;
   a terminating primary structure; and a first and a second primary structure with a first secondary structure laterally arranged between them in a first portion of the semiconductor device, the first secondary structure being terminated at the boundary to a second portion of the semiconductor device;

wherein the distance between the first and second primary structure is greater than 2*W in the first portion, and the terminating structure is located at the boundary between a first and second portion and laterally between the first and second primary structure, the minimum distance between the terminating structure and both of the first and second primary structures being smaller than 2*W.

* * * * *